US005543624A

United States Patent [19]

Bergmann

[11] Patent Number: 5,543,624

[45] Date of Patent: Aug. 6, 1996

[54] GASPHASE ION SOURCE FOR TIME-OF-FLIGHT MASS-SPECTROMETERS WITH HIGH MASS RESOLUTION AND LARGE MASS RANGE

[75] Inventor: Thorald Bergmann, Buchenweg 9a, 82441 Ohlstadt, Germany

[73] Assignees: Thorald Bergmann; Eva Martina Bergmann, both of Ohlstadt, Germany

[21] Appl. No.: 269,883

[22] Filed: Jul. 1, 1994

[30] Foreign Application Priority Data

Jul. 2, 1993 [DE] Germany .......................... 43 22 101.7

[51] Int. Cl.$^6$ ............................ H01J 37/08; H01J 49/00; B01D 59/44

[52] U.S. Cl. ....................................... 250/423 R; 250/288

[58] Field of Search .................................... 250/287, 288, 250/281, 423 R

[56] References Cited

U.S. PATENT DOCUMENTS

| | | | |
|---|---|---|---|
| 3,577,165 | 5/1971 | Helliwell et al. | 307/228 |
| 3,634,683 | 1/1972 | Bakker | 250/287 |
| 3,922,544 | 11/1975 | Maul et al. | 250/281 |
| 4,362,936 | 12/1982 | Hofmann et al. | 250/423 R. |
| 4,517,462 | 5/1985 | Boyer et al. | 250/286 |
| 5,117,107 | 5/1992 | Guilhous et al. | 250/281 |

OTHER PUBLICATIONS

J. M. B. Bakker, A beam–modulated time–of–flight mass spectrometer Part II: experimental work, J. Physics E: Scient. Instrum. 7(1974), pp. 364–378.

T. Bergmann, T. P. Martin & H. Schaber, High resolution time–of–flight mass spectrometer, Rev. Sci. Instrum. 60(4), Apr. 1989, pp. 792–793.

*Primary Examiner*—Bruce C. Anderson

*Attorney, Agent, or Firm*—William H. Murray; Robert E. Rosenthal

[57] ABSTRACT

To achieve a high mass resolution in a time-of-flight mass-spectrometer with gasphase ion source, the initial velocity components in the direction of acceleration of the ion source must be kept small. This can be done by injection the analyte gas or ion beam at right angles to the direction of acceleration into the ion source. When the direction of acceleration and the direction of the analyte gas or ion beam or not colinear, the amount of unwanted gas ballast in the drift space of the time-of-flight mass-spectrometer will be less. This will increase the dynamic range of the mass-spectrometer. The heavier an ion is, the more its path will deviate from the axis of the ion source and if it deviates too far from the axis of the ion source it will be lost. This effect gives the limit of the mass range of such an ion source. If the electrical deflection field for these ions is already within the acceleration region of the ion source, its mass range can significantly be enlarged.

9 Claims, 4 Drawing Sheets

GASPHASE ION SOURCE FOR TIME-OF-FLIGHT MASS-SPECTROMETERS WITH HIGH MASS RESOLUTION AND LARGE MASS RANGE

BACKGROUND OF THE INVENTION

1. Field of the Invention

This invention relates to gasphase ion sources for time-of-flight mass-spectrometers with any number of electrodes for the acceleration of ions and with electrodes capable of generating transverse electrical fields for changing the transverse velocity component of charged particles.

In a time-of-flight mass-spectrometer a point in time is defined, called start-time, when a group of ions is started on their path. At the end of a drift space the time is measured which an arriving ion has needed on its flight and this time is used to determine the mass of that ion.

The extraction volume is that region within the ion source of the mass-spectrometer, from which, upon start-time, ion paths lead to the surface of the detector of the time-of-flight mass-spectrometer. The paths of the ions are given by the electrical fields and the physical laws of motion within.

The start-time of time-of-flight analysis can be given by:

the point of time, when neutral particles of a gas are ionized within the extraction volume by a laser or electron beam crossing it.

the point of time when the electrode voltages of the ion source are switched on. This is usually the case when ions are to be analysed, since ions can only reach the extraction volume, when the voltages on the electrodes of the ion source are switched off.

The ion optical axis of a gasphase ion source is understood as the path of one selected ion. The path of this ion starts with the initial velocity $\vec{v}=0$ at start-time of mass analysis from some conveniently chosen point close to or at the geometric midpoint of the extraction volume. If the construction of the ion source is rotationally symmetric, the starting point of the ion optical axis is usually chosen on the axis of symmetry.

To achieve a high mass resolution in a time-of-flight mass-spectrometer with gasphase ion source, the initial velocity components in the direction of acceleration within the ion source must be kept small. This can be done by injecting the analyte gas or ion beam at right angles to the direction of acceleration into the ion source. The publication of Bergmann et al. (Review of Scientific Instruments, volume 60(4), pages 792–793, 1989) expains why this right angle is necessary and how in this manner a mass resolution of 35000 (m/Δm) FWHM (Full Width at Half Maximum) can be achieved. There are two types of ion sources that have the direction of the analyte gas or ion beam not parallel to the direction of acceleration within the ion source:

An ion source that focuses transverse velocities: This type of ion source is used when the distribution of velocities in the analyte gas or ion beam is large. This type of ion source tries—independent of initial transverse velocities—to bend all ion paths as parallel to the ion optical axis as possible. This type of ion source is not the subject of this invention and will not further be discussed here.

An ion source with deflection field: This ion source is often used, when the distribution of initial velocities within the analyte gas or ion beam is small. Since all ions need their transverse velocities changed by a very similar value, a transverse field is necessary, whose strength is independent of transverse coordinates. This type of ion source is the subject of this invention as given by the generic terms of claim 1.

A transverse electric field is understood here as an electric field whose field vector points in transverse direction. The strength of this transverse field should only have a minor dependance on the coordinate values in transverse directions. This electric field is termed deflection field, the electrodes that produce such a field are termed deflection electrodes.

2. Description of the Related Art

Aside from the possibility of achieving higher mass resolutions, gasphase ion sources corresponding to the generic terms of claim 1 have a number of further advantages:

The chapter "III. Results, A. Time-of-flight mass spectrometer" in the publication of Dietz et al. (Journal of Chemical Physics, volume 73(10), pages 4816–4821, 1980) expains a mechanism that suppresses an unwanted signal that can be caused by residual gas particles. Residual gas particles will always be present in the ion source for vacuum technical reasons.

The mass range of the ion source can be limited from above and below by applying static voltages to the deflection electrodes. FIG. 2 in the publication of Rohlfing et al. (Journal of Physical Chemistry, volume 88, pages 4497–4502, 1984) shows how it is possible to select different mass regions by changing the voltages on the deflection electrodes.

Applying a time-dependent voltage to the deflection electrodes, it is possible to transport a significantly larger mass range into the time-of-flight mass-spectrometer. This mass range is only limited by apertures along the paths. This option is described in a publication of Lubman and Jordan (Review of Scientific Instruments, volume 56(3), pages 373–376, 1985).

The physical facts leading to state-of-the-art ion source constructions are as follows:

Ions, whose initial velocity in the direction of acceleration is zero, should have a final velocity in the direction of acceleration that depends exclusively on the initial coordinate in the direction of acceleration. In particular, the final velocity in the direction of acceleration should be independent from initial coordinates in transverse directions and initial velocities in transverse directions. Such a behaviour can be induced by a homogeneous accelerating field.

After passing a homogeneous acceleration field the velocity components in transverse directions will not have changed. The transverse velocity components are independent of the starting point of the ions, which means that they are also independent from the coordinate location after passing the accelerating field. As a consequence, to change the transverse velocity components, an electric field is necessary, whose field strength in transverse directions is independent of the value of the transverse coordinate values.

All implementations known so far have separatly arranged acceleration and deflection fields, i.e. the deflection field is always arranged after the acceleration field. Usually the transverse electric field is generated by a parallel plate capacitor. In all these ion sources the mass range is limited from above, because heavy ions drift too far away from the ion optical axis before reaching the deflection field and thus are lost on apertures etc.

Taking all the above advantages of having the direction of the analyte gas or ion beam and the direction of acceleration in the ion source at right angles, the mass range limitation just named is a serious drawback.

SUMMARY OF THE INVENTION

Accordingly, it is the object of the invention to provide a gasphase ion source, that allows a larger mass range to be accelerated into the time-of-flight mass-spectrometer.

The characterizing features of the invention are given in claim 1.

In accordance with the invention the deflection field is directly superposed upon the acceleration field. This allows the deflection field to compensate as soon as possible the transverse velocity components. In this manner the ion paths do not drift far away from the ion optical axis and, as a consequence, particles with higher mass can pass through apertures along their paths.

In many cases the deflection field can be superposed directly upon the acceleration field by integrating the electrodes generating the transverse field into the acceleration field. Usually this will mean that the electrodes generating the transverse field must be arranged between the electrodes generating the acceleration field.

Further, it is of special advantage to arrange the electrodes in such a way that the electrical field thus created can be decomposed into two components, one component being a transverse electric field and the other component being an electric field with good rotational symmetry around the ion optical axis of the ion source.

DESCRIPTION OF THE PREFERRED EMBODIMENTS

Some implementation examples will now be discussed in conjunction with the drawings.

Figure 1A:
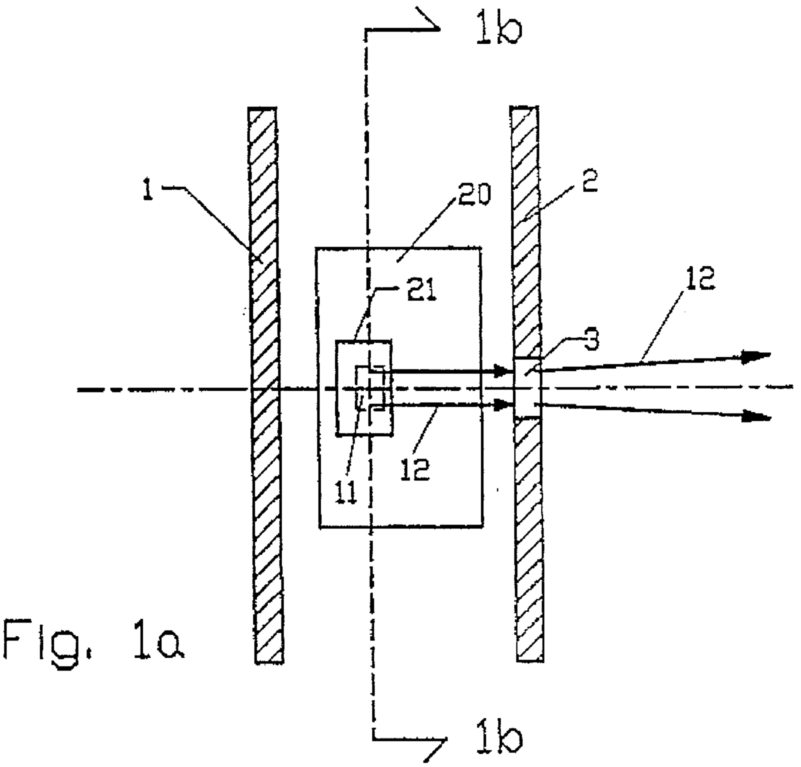
FIG. 1*a*,1*b* show the most basic implementation of the invention according to claim 1.
Figure 1B:
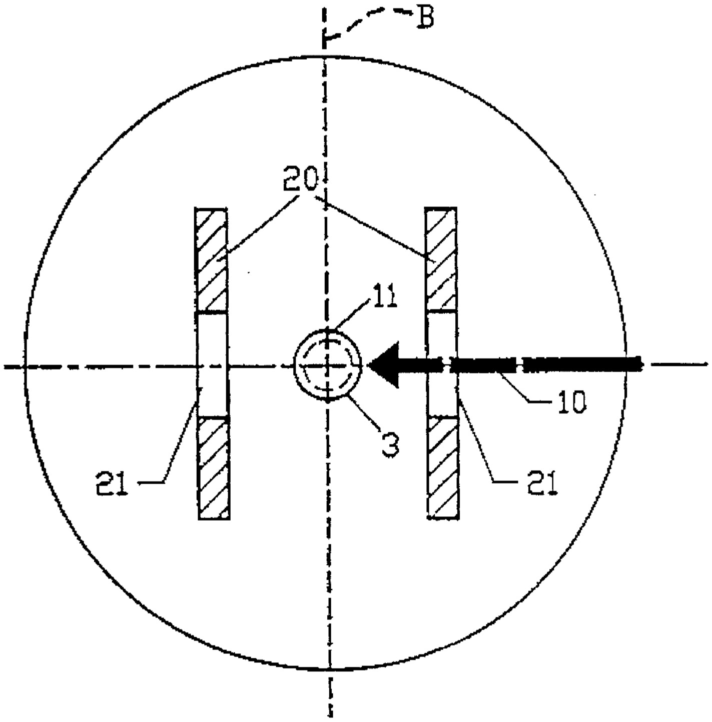

FIG. 1*a*,1*b* show the most basic implementation of the invention according to claim 1. Ions, that are in the extraction volume (11) at start-time, are accelerated on their paths (12) by the acceleration field created by the repeller electrode (1) and the acceleration electrode (2). These paths end on the detector of the time-of-flight mass-spectrometer, the guidance of the paths behind the ion source not shown here, because of existing state-of-the-art solutions. The deflection electrodes (20) shown is this example are flat plates. The deflection electrodes are arranged, as can be seen in FIG. 1*b*, symmetrically around a plane designated by (B—B'), normal to the direction of the analyte gas or ion beam (10). The analyte gas or ion beam (10) crosses the acceleration field through openings (21) within the deflection electrodes (20).

The electrodes (1,2) generating the acceleration field, in this case the acceleration electrode (2) can also serve to separate regions of different gas pressure. As an example, the opening (3) in the middle of electrode (2) would then fulfill the function of a gas flow restriction.

Flow restrictions are understood here as openings of small cross section, that are large enough to pass ions unhindered on their way to the detector. However, their conductivity for gases should be significantly lower than the pumping capacity of the pump for the region of lower gas pressure. This region of lower pressure is—as seen along the direction of flight for the ions—usually behind the gas flow restriction.

Gas flow restrictions thus have the advantage of allowing a high particle density in the extraction volume and simultaneously allowing a very low residual gas pressure in the other regions of the time-of-flight mass-spectrometer. In this manner it is possible to minimize collisions of atoms or molecules of the residual gas with ions on their path to the detector, these collisions having the property of reducing the dynamic range of the time-of-flight mass-spectrometer.

The combination of arranging the deflection electrodes between the acceleration electrodes (1,2) and integrating gas flow restrictions into the acceleration electrodes (1,2) has the effect that heavy ions can reach the detector and, in addition to that, that these ions will be less inhibited on their path by collision events.

The electrode arrangement shown in the implementation example of FIG. 1*a*,1*b* creates an electric field that is superposed from a transverse electric field and an acceleration field. In this electric field the initially existing transverse velocity components are for a large part compesated already during the acceleration phase. With this arrangement, it is possible to accelerate ions of high masses into the time-of-flight mass-spectrometer.

However, the arrangement shown in FIG. 1*a*,1*b* is not yet the optimum solution. After subtracting the transverse field, i.e. after equalizing the voltages on the left and right deflection electrodes, the electric field remaining in the region of the extraction volume is not very homogeneous. This will cause flight time errors that are difficult to compensate. Flight time errors tend to increase with increasing distance to the ion optical axis. If some limit is given, below which flight time errors are tolerable, an inhomogeneous electric field in the vicinity of the extraction volume will reduce the acceptable distance of an ion path toward the ion optical axis, i.e. will reduce the usable size of the extraction volume. This has the effect of reducing the sensitivity of the time-of-flight mass-spectrometer.

The implementation shown in FIG. 1*a*,1*b* is, referred to the ion optical axis, an anisotropic construction. As a consequence, ions will be focused resp. defocused anisotropically flying through the acceleration region, resulting in the need for a further anisotropic lens element further down the path. Anisotropic lens designs generally need more construction parts, are more expensive and more difficult to align than lens elements of rotational symmetry.

From the above reasoning one can recognize the restriction which that part of the electrical field must satisfy, that remains after subtraction of the transverse part:

1. In the vicinity of the extraction volume it should be acceptably homogeneous.

2. In the complete space of the ion source it should have rotational symmetry.

Especially the second restriction is significantly weakened as compared to the restrictions that are used for state-of-the-art designs. The second restriction means that it is not necessary to superpose a field that is homogeneous in the complete space of the ion source with a transverse field. It is only necessary to superpose a rotationally symmetric field with the transverse field. A sufficient homogeneity in the small vicinity around the extraction volume is easily achieved then.

An electrical field with the necessary properties can be generated with an electrode arrangement, where the deflection electrodes themselves have a rotationally symmetric form. After subtraction of the transverse field components, the remaining part of the electric field will have rotational symmetry.

Figure 2A:
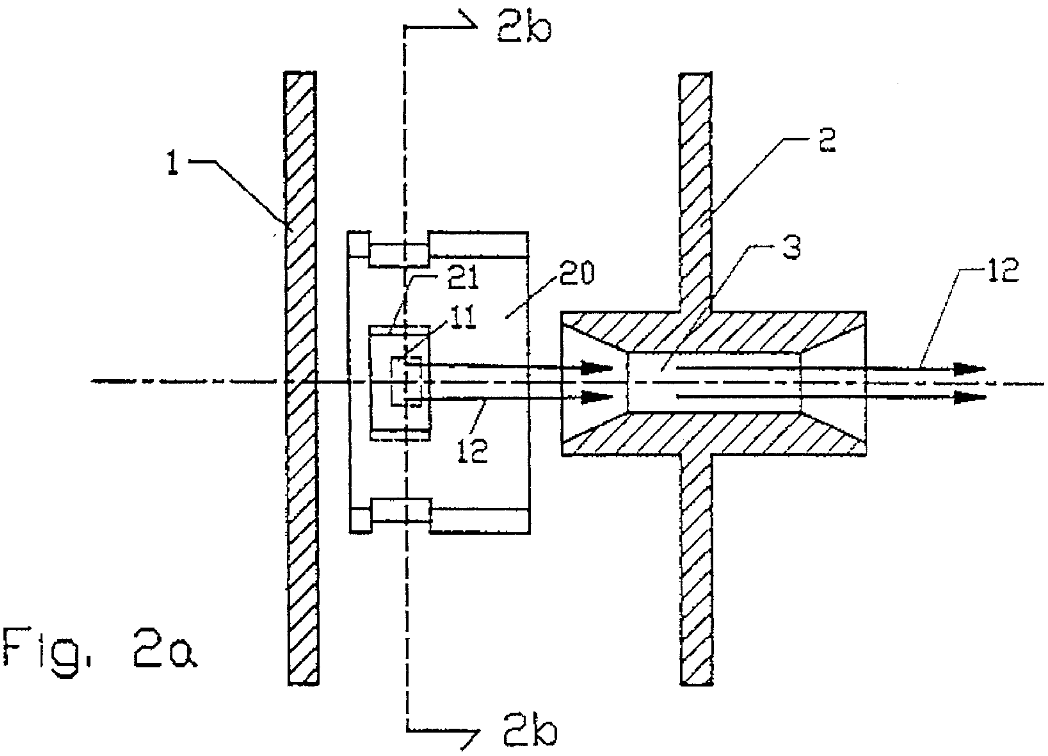
FIG. 2*a*,2*b* show an implementation, in which the electric fields can be separated into two components, one being a transversal field, the remainder having almost perfect rotational symmetry.
Figure 2B:
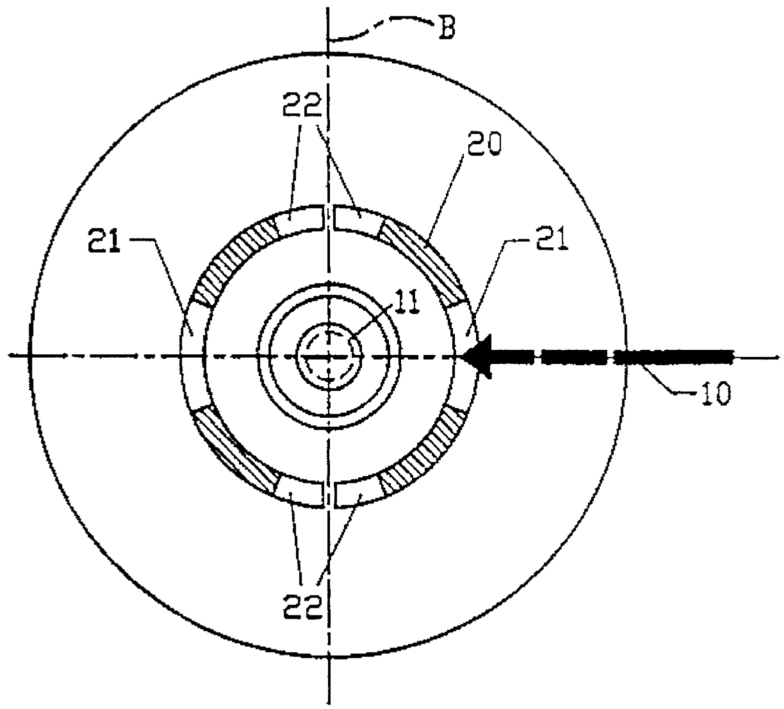

An example of this implementation is shown in FIG. 2*a*,2*b*. As can be seen in FIG. 2*b*, the deflection electrodes (20) (hatched) are arranged rotationally symmetric to the ion optical axis of the ion source. In this way an electric field with the necessary properties can be generated. This electric field can be decomposed into two components:

- a transverse electric field. The field vector and strength in transverse direction of this field component is only weekly dependent upon the coordinate values in transverse directions. This component of the field can be generated by setting the left and right deflection electrodes to antisymmetric potentials and grounding the remaining electrodes.
- a field of almost perfect rotational symmetry, this field also being sufficiently homogeneous in the vicinity of the extraction volume. This field component can be generated by setting the left and right deflection electrodes to identical potentials.

The analyte gas or ion beam (10) crosses the acceleration field via openings (21) in both deflection electrodes. The ionizing electron or laser beam can pass through recesses (22) between the two deflection electrodes.

The gas flow restriction (3) on the acceleration electrode (2) is implemented here as a tube, a tube having a lower conductivity for gases than an aperture of the same cross section. However, as shown in FIG. 1*a*, a hole can also serve as gas flow restriction.

Aside from the favourable field properties, the rotationally symmetric form of the deflection electrodes has the further advantage, that the deflection electrodes can be machined in a first construction step as one part on a lathe. In a later construction step this part can then be split into the two deflection electrodes.

Figure 3A:
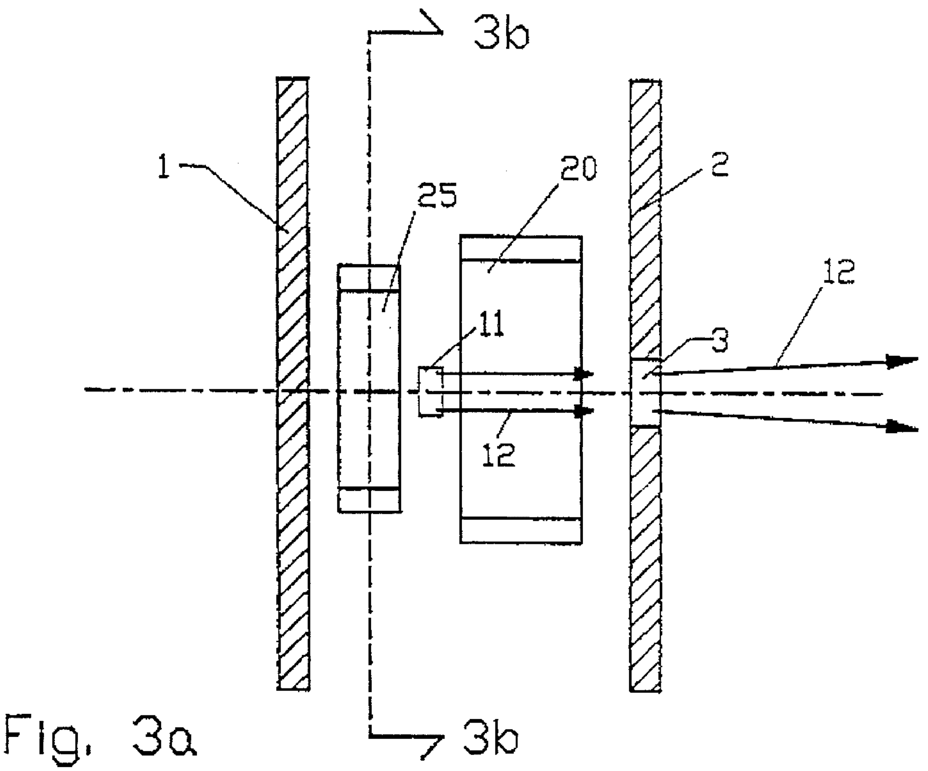
FIG. 3*a*,3*b* show an implementation with two deflection electrode pairs.
Figure 3B:
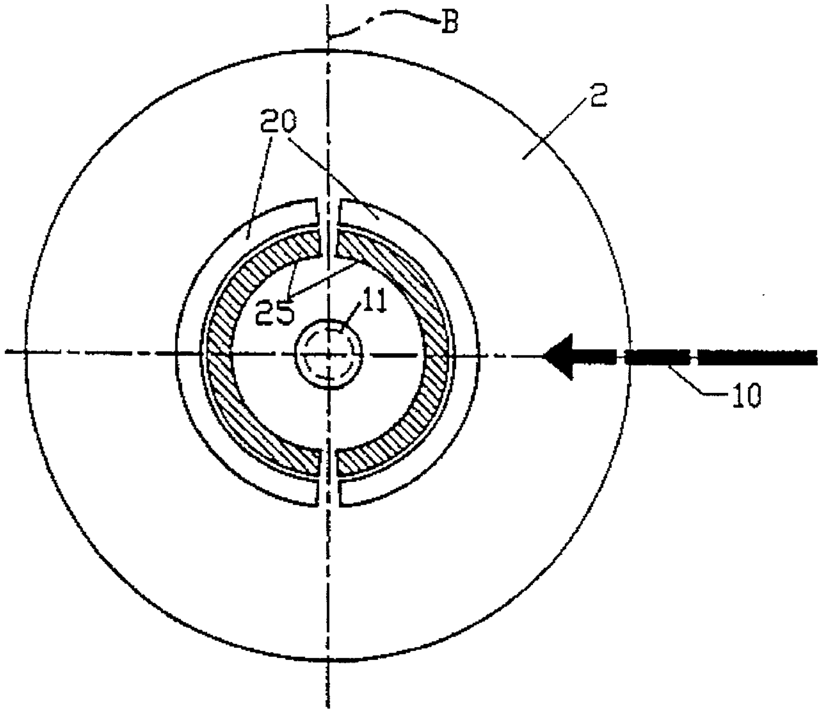

FIG. 3*a*,3*b* give an example of arranging two pairs of deflection electrodes (20,25). Using two pairs of deflection electrodes has the advantage, that no openings for the analyte gas or ion beam or the ionizing laser beam have to be machined into the deflection electrodes. Aside from that, the volume of the acceleration region can thus be better pumped out. As shown in FIG. 3*a*,3*b*, the two deflection electrode pairs may have different radii toward the axis of the ion source.

The examples of FIG. 2*a*,2*b* and FIG. 3*a*,3*b* show deflection electrodes that have for the main part rotationally symmetric form, except being split in a plane denoted by (B—B'). This guarantees that after subtraction of the transverse field component the remaining field has a good rotational symmetry. However, a small part with quadrupole symmetry remains, this part being caused by the slits between the two half-parts of the deflection electrodes. In lowest order, the potential value of a quadrupole field is proportional to the square of the distance from the axis.

Figure 4A:
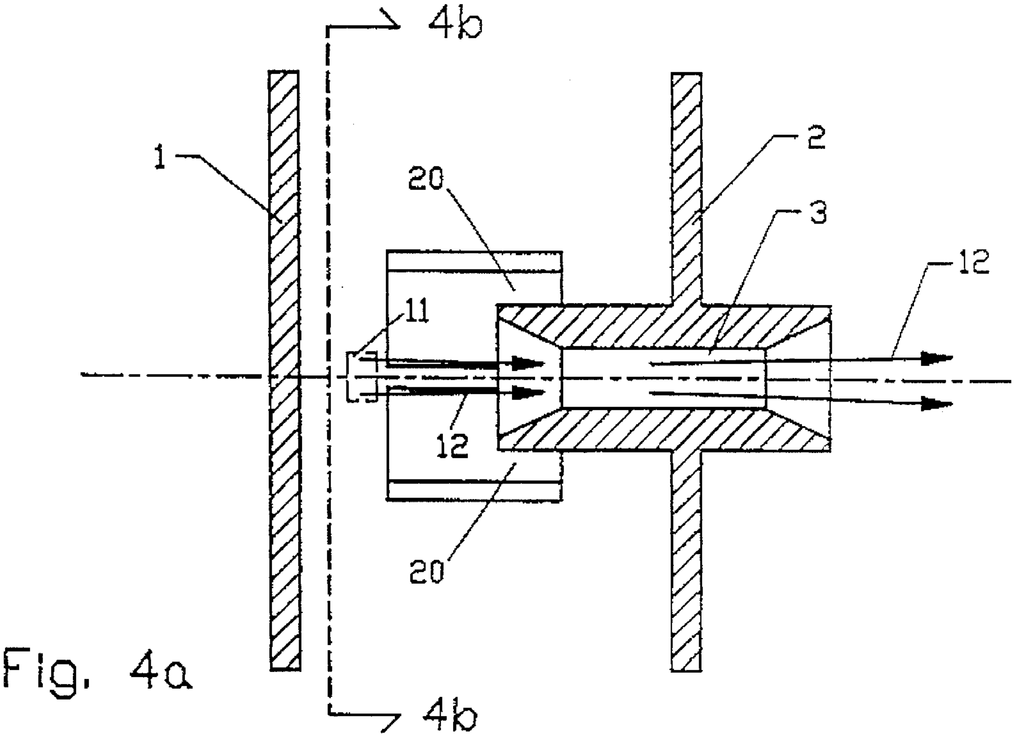
FIG. 4*a*,4*b* show an method of further improving the symmetry of the almost rotationally symmetric field, that remains after subtracting the transverse electrical field component.
Figure 4B:
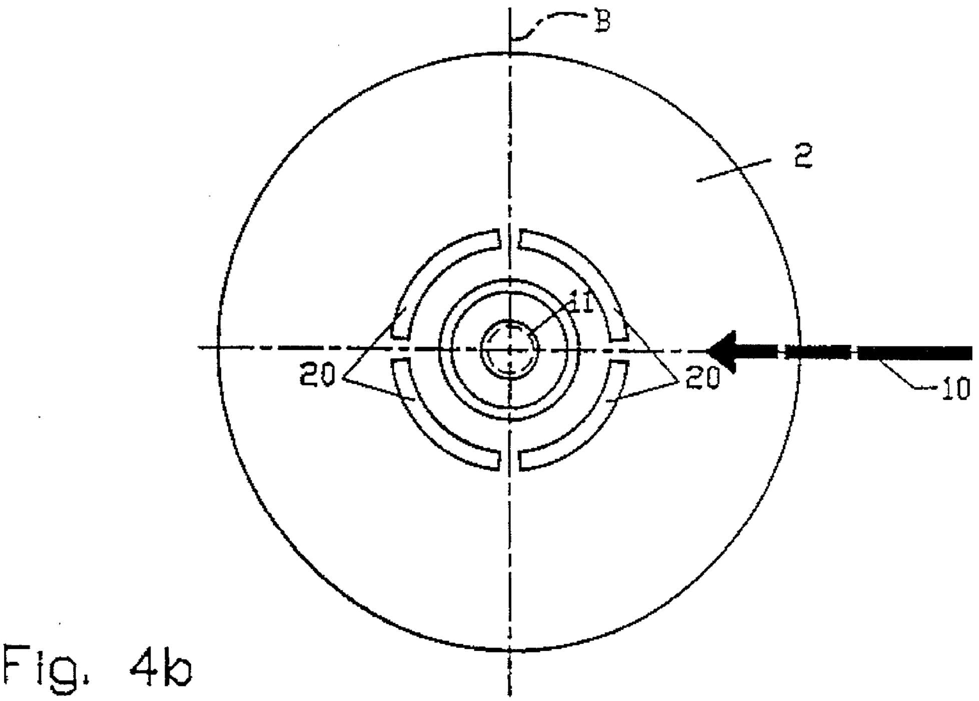

FIG. 4*a*,4*b* show, how the deflection electrodes (20) can be split into symmetric parts, along a second plane, this plane being defined by the direction of acceleration and the direction of the analyte gas or ion beam (10). For symmetry reasons, the quadrupole component must be zero in this arrangement. The non-rotationally symmetric part that now remains has octupole symmetry, the potential value of that part being proportional to the fourth power of the distance to the symmetry axis. This arrangement is to be used, should higher demands on the symmetry of the electric field or the imaging properties of the ion source arise.

I claim:

1. A gasphase ion source from within which ions are started on their path into time-of-flight mass-spectrometers, in which the analyte gas or ion beam (10) has a velocity component normal to the direction of acceleration in the ion source, in which is defined a region of space called extraction volume (11), said region containing ions at start-time of mass-analysis, the mass of said ions being determined by measuring their time-of-flight, with electrodes (1,2) for defining an acceleration field, and electrodes (20,25) for generating a transverse electric field, that can be used to change transverse velocity components of charged particles characterized by a geometrically continuous region of space, in which the accelerating and transverse fields are superposed, said region of space containing the extraction volume (11).

2. A gasphase ion source for time-of-flight mass-spectrometers according to claim 1, characterized by electrodes (20,25) capable of generating a transverse field, said electrodes being arranged within the acceleration field.

3. A gasphase ion source for time-of-flight mass-spectrometers according to claim 2, characterized by electrodes (20,25) capable of generating a transverse field, said electrodes being arranged between the electrodes (1,2) that generate the acceleration field.

4. A gasphase ion source for time-of-flight mass-spectrometers according to claim 1, characterized by electrodes (20,25) capable of generating a transverse field, said electrodes having for the main part rotationally symmetric form around the axis pointing in the direction of acceleration of said ion source, said electrodes being split along a plane (B—B') into two symmetric half-parts, said plane being normal to the direction of flight of the analyte gas or ion beam.

5. A gasphase ion source for time-of-flight mass-spectrometers according to claim 1, characterized by electrodes (1,2) for generating the acceleration field and electrodes (20,25) for generating the transverse field, all said electrodes having constant voltages.

6. A gasphase ion source for time-of-flight mass-spectrometers according to claim 1, characterized by electrodes (1,2) for generating the acceleration field and electrodes (20,25) for generating the transverse field, one or several of said electrodes having constant voltages and one or several of said electrodes having time-dependent voltages.

7. A gasphase ion source for time-of-flight mass-spectrometers according to claim 1, characterized by electrodes (1,2) for generating the acceleration field and electrodes (20,25) for generating the transverse field, all said electrodes having time-dependent voltages.

8. A gasphase ion source for time-of-flight mass-spectrometers according to claim 1, characterized by electrodes (20,25) defining a transverse electrical field, said electrodes being additionally split symmetrically along a plane, said plane being defined by two vectors, one of said vectors being the direction of the analyte gas or ion beam, the other of said vectors being the direction of acceleration in the ion source.

9. A gasphase ion source for time-of-flight mass-spectrometers according to claim 1, characterized by electrodes (1,2), one or several of said electrodes representing a boundary between regions of different gas pressure within the time-off-light mass-spectrometer, and gas flow restrictions (3) that are integrated into said electrodes.

* * * * *